United States Patent
Chen et al.

(10) Patent No.: US 10,128,193 B2
(45) Date of Patent: Nov. 13, 2018

(54) PACKAGE STRUCTURE AND METHOD FOR FORMING THE SAME

(71) Applicant: Taiwan Semiconductor Manufacturing Co., Ltd., Hsinchu (TW)

(72) Inventors: Shing-Chao Chen, Zhubei (TW); Chih-Wei Lin, Zhubei (TW); Ching-Yao Lin, New Taipei (TW); Ming-Da Cheng, Zhubei (TW); Ching-Hua Hsieh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/413,690

(22) Filed: Jan. 24, 2017

(65) Prior Publication Data

US 2018/0151500 A1  May 31, 2018

Related U.S. Application Data

(60) Provisional application No. 62/427,422, filed on Nov. 29, 2016.

(51) Int. Cl.
*H01L 21/4763* (2006.01)
*H01L 23/538* (2006.01)
(Continued)

(52) U.S. Cl.
CPC ........ *H01L 23/5389* (2013.01); *H01L 21/486* (2013.01); *H01L 21/4853* (2013.01);
(Continued)

(58) Field of Classification Search
CPC ............. H01L 23/5389; H01L 21/4853; H01L 21/486; H01L 21/4857; H01L 21/565; H01L 2225/1035
(Continued)

(56) References Cited

U.S. PATENT DOCUMENTS 5,111,278 A * 5/1992 Eichelberger ......... H01L 23/473
257/698
5,250,843 A * 10/1993 Eichelberger ......... H01L 23/538
257/687

(Continued)

*Primary Examiner* — Nitin Parekh
(74) *Attorney, Agent, or Firm* — Birch, Stewart, Kolasch & Birch, LLP

(57) ABSTRACT

A package structure and methods for forming the same are provided. The package structure includes an integrated circuit die in a package layer. The package structure also includes a first passivation layer covering the package layer and the integrated circuit die, and a second passivation layer over the first passivation layer. The package structure further includes a seed layer and a conductive layer in the second passivation layer. The seed layer covers the top surface of the first passivation layer and extends into the first passivation layer. The conductive layer covers the seed layer and extends into the first passivation layer. In addition, the package structure includes a third passivation layer covering the second passivation layer. The seed layer further extends from the top surface of the first passivation layer to the third passivation layer along a sidewall of the conductive layer.

20 Claims, 14 Drawing Sheets

(51) Int. Cl.
    *H01L 21/48*   (2006.01)
    *H01L 21/56*   (2006.01)
    *H01L 23/31*   (2006.01)
    *H01L 25/10*   (2006.01)

(52) U.S. Cl.
    CPC ...... *H01L 21/4857* (2013.01); *H01L 21/4864* (2013.01); *H01L 21/565* (2013.01); *H01L 23/3114* (2013.01); *H01L 23/5383* (2013.01); *H01L 23/5384* (2013.01); *H01L 23/5386* (2013.01); *H01L 25/105* (2013.01); *H01L 2225/1035* (2013.01); *H01L 2225/1058* (2013.01)

(58) Field of Classification Search
    USPC .......................................................... 438/622
    See application file for complete search history.

(56) References Cited

U.S. PATENT DOCUMENTS

| | | | |
|---|---|---|---|
| 5,866,952 A * | 2/1999 | Wojnarowski | H01L 21/568 257/687 |
| 5,960,317 A * | 9/1999 | Jeong | H01L 21/7684 257/E21.244 |
| 6,184,143 B1 * | 2/2001 | Ohashi | H01L 21/76819 257/E21.244 |
| 6,271,469 B1 * | 8/2001 | Ma | H01L 21/56 174/521 |
| 6,709,897 B2 * | 3/2004 | Cheng | H01L 23/13 257/E23.004 |
| 7,030,494 B2 * | 4/2006 | Aoki | H01L 23/5389 257/415 |
| 7,737,038 B2 * | 6/2010 | Lee | B24B 37/013 438/626 |
| 7,741,194 B2 * | 6/2010 | Griffiths | H01L 21/6835 257/E21.122 |
| 8,004,095 B2 * | 8/2011 | Shim, II | H01L 21/568 257/774 |
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 8,900,929 B2 * | 12/2014 | Lin | H01L 23/49816 257/735 |
| 9,601,434 B2 * | 3/2017 | Lin | H01L 23/49816 |
| 2004/0043698 A1 * | 3/2004 | Jiang | B24B 37/26 451/5 |
| 2005/0116337 A1 * | 6/2005 | Chua | H01L 23/5389 257/723 |
| 2006/0125072 A1 * | 6/2006 | Mihara | H01L 23/5389 257/686 |
| 2011/0133341 A1 * | 6/2011 | Shimizu | H01L 23/3185 257/773 |
| 2011/0291288 A1 | 12/2011 | Wu et al. | |
| 2012/0018904 A1 * | 1/2012 | Lin | H01L 21/561 257/782 |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0091454 A1 * | 4/2014 | Lin | H01L 21/4853 257/734 |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |

* cited by examiner

PACKAGE STRUCTURE AND METHOD FOR FORMING THE SAME

CROSS REFERENCE TO RELATED APPLICATIONS

This Application claims the benefit of U.S. Provisional Application No. 62/427,422, filed on Nov. 29, 2016, and entitled "Package structure and method for forming the same", the entirety of which is incorporated by reference herein.

BACKGROUND

With the constant evolution of semiconductor technology, semiconductor dies are becoming increasingly smaller. More functions, however, need to be integrated into these semiconductor dies. Accordingly, these semiconductor dies have increasingly greater numbers of I/O pads packaged into smaller areas, and the density of the I/O pads is quickly rising. As a result, the packaging of semiconductor dies is becoming more challenging.

Packaging technologies can be divided into multiple categories. In one of the categories of packaging, dies are sawed from wafers before they are packaged onto other wafers, and "known-good-dies" are packaged. An advantage of this packaging technology is the possibility of forming fan-out chip packages, which means that the I/O pads on a die can be redistributed to a greater area than the die itself. Therefore, the number of I/O pads packed on the surfaces of the dies can be increased.

New packaging technologies have been developed to further improve the density and functions of semiconductor dies. These relatively new types of packaging technologies for semiconductor dies face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
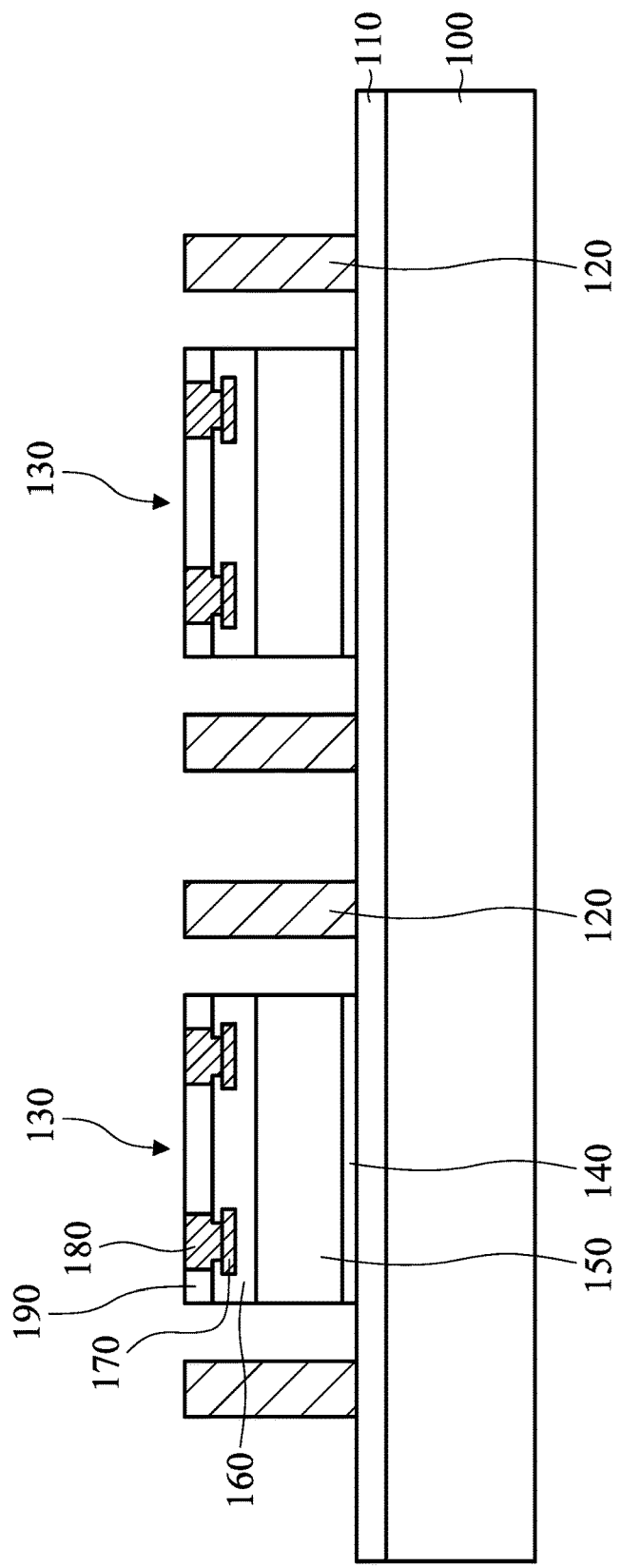
FIGS. 1A-1L are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments for a package structure and methods for forming the same are described. The package structure may be applied to wafer level package (WLP).

FIGS. 1A-1L are cross-sectional views of various stages of a process for forming a package structure, in accordance with some embodiments. Although some embodiments are discussed with operations performed in a particular order, these operations may be performed in another logical order. Additional operations can be provided before, during, and/or after the stages described in FIGS. 1A-1L. Some of the stages that are described can be replaced or eliminated for different embodiments. Additional features can be added to the package structure. Some of the features described below can be replaced or eliminated for different embodiments.

As shown in FIG. 1A, a carrier substrate 100 is provided, in accordance with some embodiments. In some embodiments, the carrier substrate 100 is used as a temporary substrate. The temporary substrate provides mechanical and structural support during subsequent processing steps, such as those described in more detail later. The carrier substrate 100 is made of a semiconductor material, ceramic material, polymer material, metal material, another suitable material, or a combination thereof. In some embodiments, the carrier substrate 100 is a glass substrate. In some other embodiments, the carrier substrate 100 is a semiconductor substrate, such as a silicon wafer.

As shown in FIG. 1A, an adhesive layer 110 is deposited over the carrier substrate 100, in accordance with some embodiments. In some embodiments, the adhesive layer 110 is used as a temporary adhesive layer. The adhesive layer 110 may be made of glue, or may be a lamination material, such as a foil. In some embodiments, the adhesive layer 110 is photosensitive and is easily detached from the carrier substrate 100 by light irradiation. For example, shining ultra-violet (UV) light or laser light on the carrier substrate 100 is used to detach the adhesive layer 110. In some embodiments, the adhesive layer 110 is a light-to-heat-conversion (LTHC) coating. In some other embodiments, the adhesive layer 110 is heat-sensitive and is easily detached from the carrier substrate 100 when it is exposed to heat.

As shown in FIG. 1A, multiple conductive features 120 are formed over the adhesive layer 110, in accordance with some embodiments. In some embodiments, the conductive features 120 are conductive pillars or other suitable structures. The conductive features 120 may be referred to as through interposer vias (TIVs).

In some embodiments, the conductive features 120 include copper (Cu), aluminum (Al), nickel (Ni), platinum (Pt), another suitable conductive material, or a combination thereof. In some embodiments, the conductive features 120 are formed using an electroplating process, an electroless plating process, a sputtering process, a physical vapor deposition (PVD) process, a chemical vapor deposition (CVD) process, an electrochemical deposition (ECD) process, a molecular beam epitaxy (MBE) process, an atomic layer deposition (ALD) process, or another applicable process.

For example, a mask layer (not shown) is formed over the adhesive layer 110. The mask layer has openings that define the positions where the conductive features 120 will be formed. A conductive material is deposited to completely or partially fill the openings in the mask layer. The conductive material and the mask layer may be planarized and thinned. Afterwards, the mask layer is removed, and the deposited conductive material forms the conductive features 120, as shown in FIG. 1A. In some embodiments, a cutting device is used to planarize the conductive material and the mask layer.

Subsequently, multiple integrated circuit dies 130 are disposed on the adhesive layer 110, as shown in FIG. 1A in accordance with some embodiments. The integrated circuit dies 130 are sawed from wafers, and may be "known-good-dies". In some embodiments, the front side (or the active surface) of each integrated circuit die 130 faces away from the adhesive layer 110. The back side (or the non-active surface) of each integrated circuit die 130 faces the adhesive layer 110.

In some embodiments, the back side of the integrated circuit dies 130 is bonded or attached to the adhesive layer 110 through an adhesive layer 140. In some embodiments, the adhesive layer 140 includes a die attach film (DAF), another suitable adhesive material, or a combination thereof.

In some embodiments, the conductive features 120 are on two opposite sides of the integrated circuit dies 130. In some other embodiments, the conductive features 120 discontinuously surround the integrated circuit dies 130.

Each of the integrated circuit dies 130 may include a semiconductor substrate 150, an interconnection structure 160, conductive pads 170, connectors 180, and a protection layer 190, as shown in FIG. 1A. Various active elements (not shown) are formed in and/or over the semiconductor substrate 150, in accordance with some embodiments. Examples of the various active elements include transistors, diodes, another suitable active element, or a combination thereof. For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc. Various passive elements (not shown) may also be formed in and/or over the semiconductor substrate 150. Examples of the various passive elements include capacitors, inductors, resistors, another suitable passive element, or a combination thereof.

The interconnection structure 160 is positioned over the semiconductor substrate 150. The interconnection structure 160 may include an interlayer dielectric (ILD) layer, intermetal dielectric (IMD) layers, one or more passivation layers, and multiple conductive features (not shown). These dielectric and passivation layers cover the active and/or passive elements over the semiconductor substrate 150. The conductive features are positioned in the dielectric layers, covered by the passivation layers, and electrically connected to the elements in and/or over the semiconductor substrate 150. The conductive features may include conductive contacts, conductive lines and/or conductive vias.

In some embodiments, the conductive pads 170 are positioned over the dielectric layers of the interconnection structure 160 and partially covered by the passivation layers of the interconnection structure 160. As a result, the interconnection structure 160 partially exposes the conductive pads 170. The conductive pads 170 are electrically connected to the elements in and/or over the semiconductor substrate 150 through the conductive features in the dielectric layers of the interconnection structure 160.

In some embodiments, the connectors 180 and the protection layer 190 are positioned over the interconnection structure 160. The connectors 180 are physically and electrically connected to the exposed conductive pads 170, and are enclosed by the protection layer 190. The connectors 180 may be conductive pillars (such as Cu pillars), other suitable connectors, or a combination thereof. The protection layer 190 may be a dielectric layer.

Figure 1B:
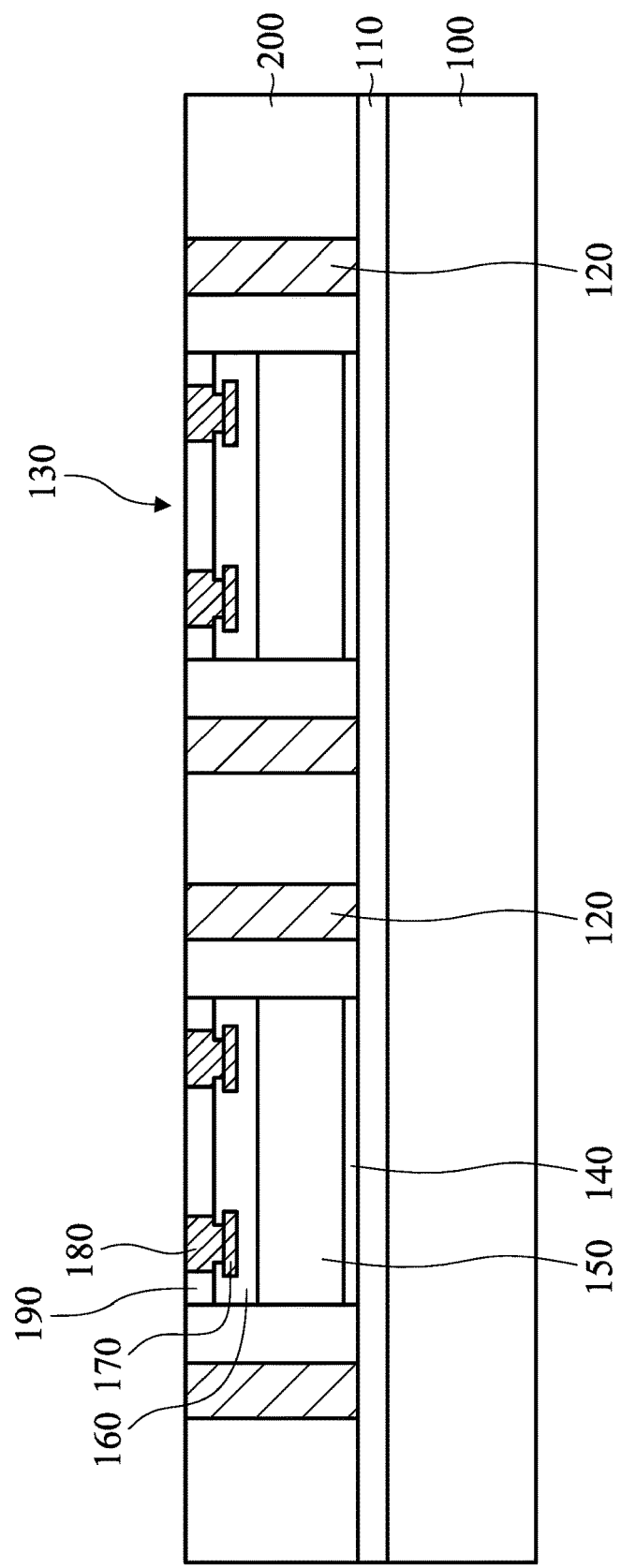

As shown in FIG. 1B, a package layer 200 is deposited over the adhesive layer 110, in accordance with some embodiments. As a result, the conductive features 120 and the integrated circuit dies 130 are surrounded by the package layer 200. The top surfaces of the conductive features 120 and the integrated circuit dies 130 are exposed from the package layer 200. For example, the connectors 180 and the protection layer 190 are exposed from the package layer 200.

In some embodiments, the package layer 200 includes a polymer material. In some embodiments, the package layer 200 includes a molding compound. In some embodiments, the package layer 200 is deposited using a molding process. In some embodiments, a liquid molding compound material is applied over the adhesive layer 110. In some embodiments, a thermal process is then performed to harden the molding compound material and to transform it into the package layer 200. As a result, the conductive features 120 and the integrated circuit dies 130 are encapsulated by the deposited package layer 200.

In some embodiments, the deposited package layer 200 does not cover the top surfaces of the conductive features 120 and the integrated circuit dies 130. In some embodiments, the top surface of the deposited package layer 200 is substantially coplanar with the top surfaces of the conductive features 120 and the integrated circuit dies 130. In some embodiments, no planarization process is performed over the deposited package layer 200.

However, embodiments of the disclosure are not limited thereto. In some other embodiments, the deposited package layer 200 covers the top surfaces of the conductive features 120 and the integrated circuit dies 130. Afterwards, the deposited package layer 200 is thinned to expose the top surfaces of the conductive features 120 and the integrated circuit dies 130. A planarization process may be used to thin the deposited package layer 200. The planarization process includes a grinding process, a chemical mechanical polishing (CMP) process, an etching process, another applicable process, or a combination thereof.

Subsequently, a redistribution structure is formed over the package layer 200 and the integrated circuit dies 130, in accordance with some embodiments. The redistribution structure includes one or more passivation layers and one or more conductive layers. For example, the redistribution structure includes passivation layers 210, 230, 300 and 320 and conductive layers 270' and 350, which will be described in more detail later.

Figure 1C:
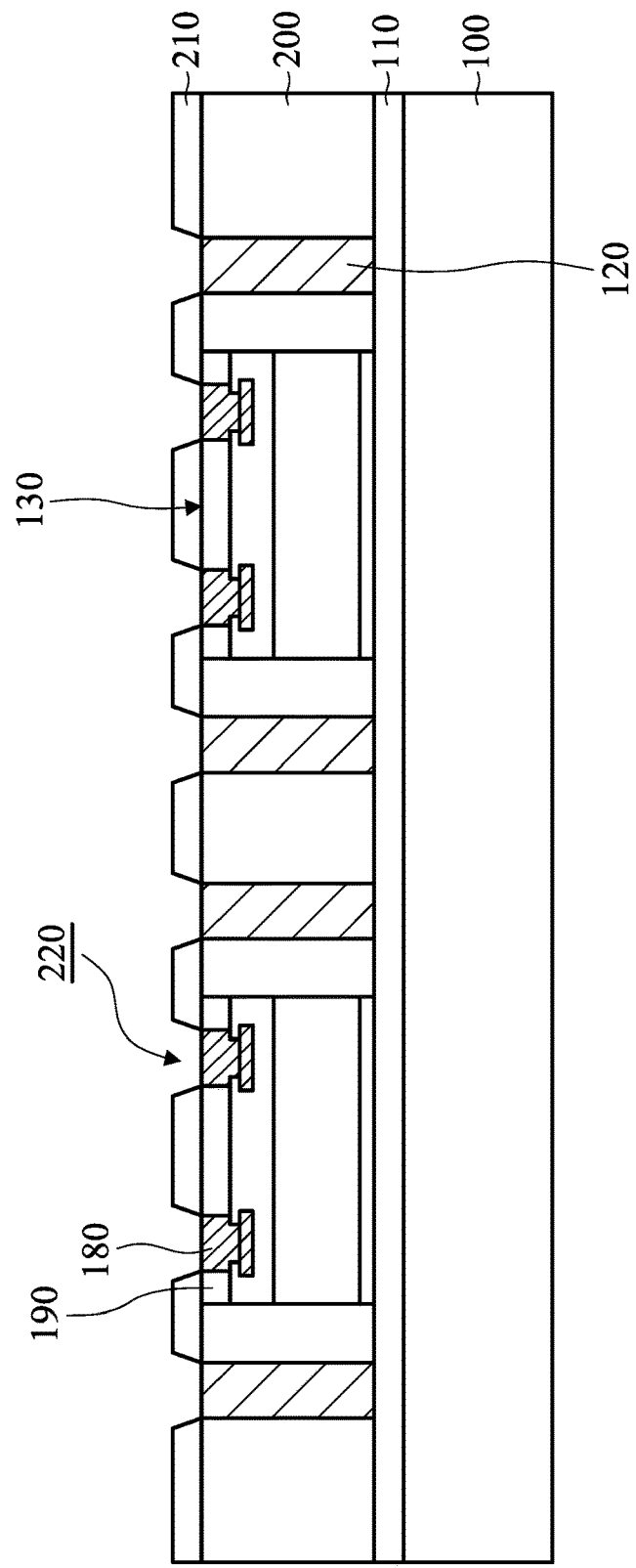

As shown in FIG. 1C, the passivation layer 210 is deposited over the package layer 200, in accordance with some embodiments. The deposited passivation layer 210 covers the integrated circuit dies 130 and the conductive features 120. Afterwards, the deposited passivation layer 210 is partially removed to form openings 220.

In some embodiments, the connectors 180 of the integrated circuit dies 130 are partially or completely exposed through some of the openings 220. In some embodiments, the conductive features 120 are partially or completely exposed through some of the openings 220. The top-view profile of the openings 220 may be circular, circle-like, oval, rectangular, square, or another suitable shape.

In some embodiments, the passivation layer 210 is made of a photosensitive material, such as a photoresist material. In some embodiments, the passivation layer 210 is made of polybenzoxazole (PBO), benzocyclobutene (BCB), silicone, acrylates, siloxane, another suitable material, or a combination thereof. In some other embodiments, the passivation layer 210 is made of non-organic materials. The non-organic materials includes silicon oxide, un-doped silicate glass, silicon oxynitride, solder resist (SR), silicon nitride, silicon carbide, hexamethyldisilazane (HMDS), another suitable material, or a combination thereof.

In some embodiments, the passivation layer 210 is deposited using a spray coating process, a spin-on process, a CVD process, an ALD process, a PVD process, another applicable process, or a combination thereof. In some embodiments, the passivation layer 210 is photopatternable, and the openings 220 in the passivation layer 210 are formed using a photolithography process including exposure and developing stages. However, embodiments of the disclosure are not limited thereto. In some other embodiments, the openings 220 in the passivation layer 210 are formed using photolithography and etching processes.

Figure 1D:
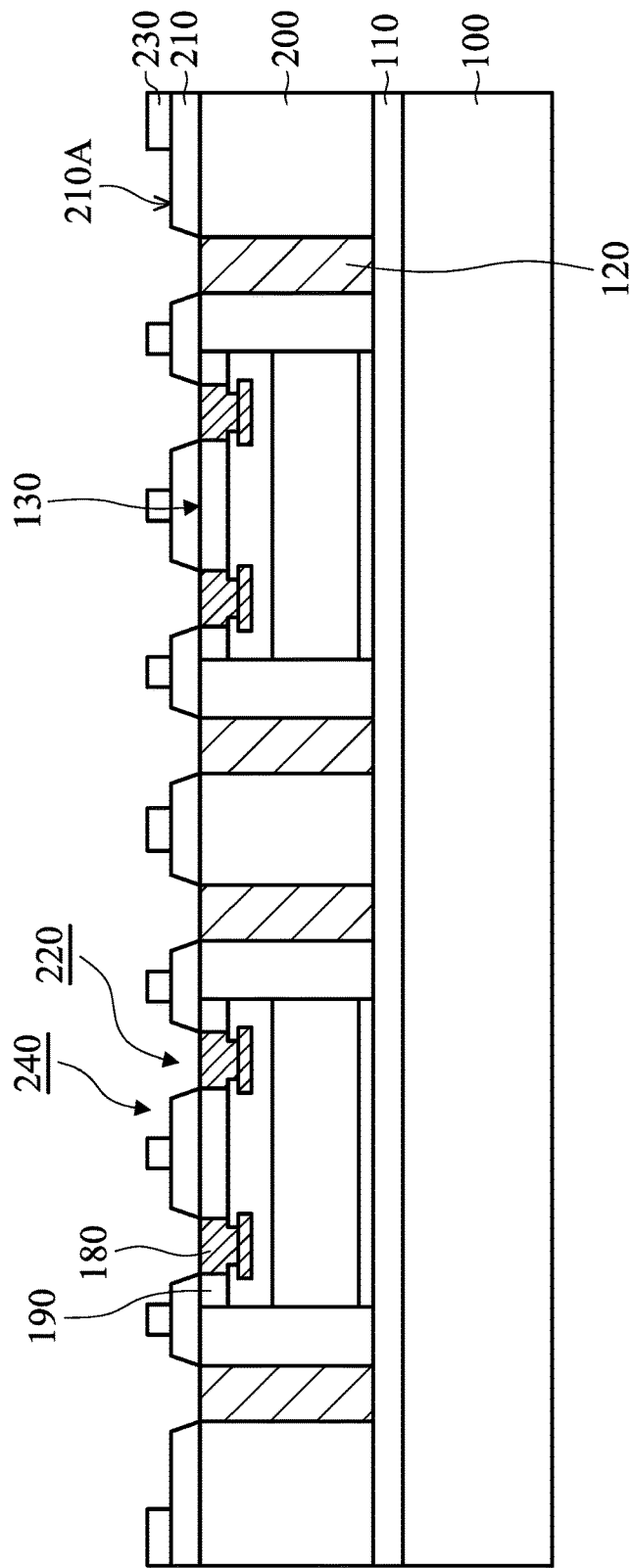

As shown in FIG. 1D, the passivation layer 230 is deposited over the passivation layer 210, in accordance with some embodiments. Afterwards, the deposited passivation layer 230 is partially removed to form openings 240. The openings 240 may be in connection with each other so that channels are formed in the passivation layer 230. The openings 240 are in connection with the openings 220 in the passivation layer 210. As a result, the openings 220 and the openings 240 together define the pattern of a first redistribution layer (RDL). In some embodiments, the openings 220 and the openings 240 together define the pattern of the subsequently formed conductive layer 270 shown in FIG. 1H, which will be described in more detail later.

In some embodiments, since openings 240 are in connection with the openings 220, the connectors 180 of the integrated circuit dies 130 are partially or completely exposed through some of the openings 240. In some embodiments, the conductive features 120 are partially or completely exposed through some of the openings 240.

In some embodiments, the size of the openings 240 is greater than that of the openings 220. As a result, the top surface 210A of the passivation layer 210 is partially exposed through the openings 240. The top-view profile of the openings 240 may be linear or another suitable shape. In some embodiments, the top view profile of the openings 240 is different from that of the openings 220. For example, the top-view profile of the openings 240 is linear while the top-view profile of the openings 220 is circular or circle-like. However, embodiments of the disclosure are not limited thereto.

In some embodiments, the passivation layer 230 is made of a photosensitive material, such as a photoresist material. In some embodiments, the passivation layer 230 is made of PBO, BCB, silicone, acrylates, siloxane, another suitable material, or a combination thereof. In some other embodiments, the passivation layer 230 is made of non-organic materials. The non-organic materials includes silicon oxide, un-doped silicate glass, silicon oxynitride, SR, silicon nitride, silicon carbide, HMDS, another suitable material, or a combination thereof.

In some embodiments, the passivation layer 210 and the passivation layer 230 include the same material. However, embodiments of the disclosure are not limited thereto. In some other embodiments, the passivation layer 210 and the passivation layer 230 include different materials.

In some embodiments, the passivation layer 230 is deposited using a spray coating process, a spin-on process, a CVD process, an ALD process, a PVD process, another applicable process, or a combination thereof. In some embodiments, the passivation layer 230 is photopatternable, and the openings 240 in the passivation layer 230 are formed using a photolithography process including exposure and developing stages. However, embodiments of the disclosure are not limited thereto. In some other embodiments, the openings 240 in the passivation layer 230 are formed using photolithography and etching processes.

Figure 1E:
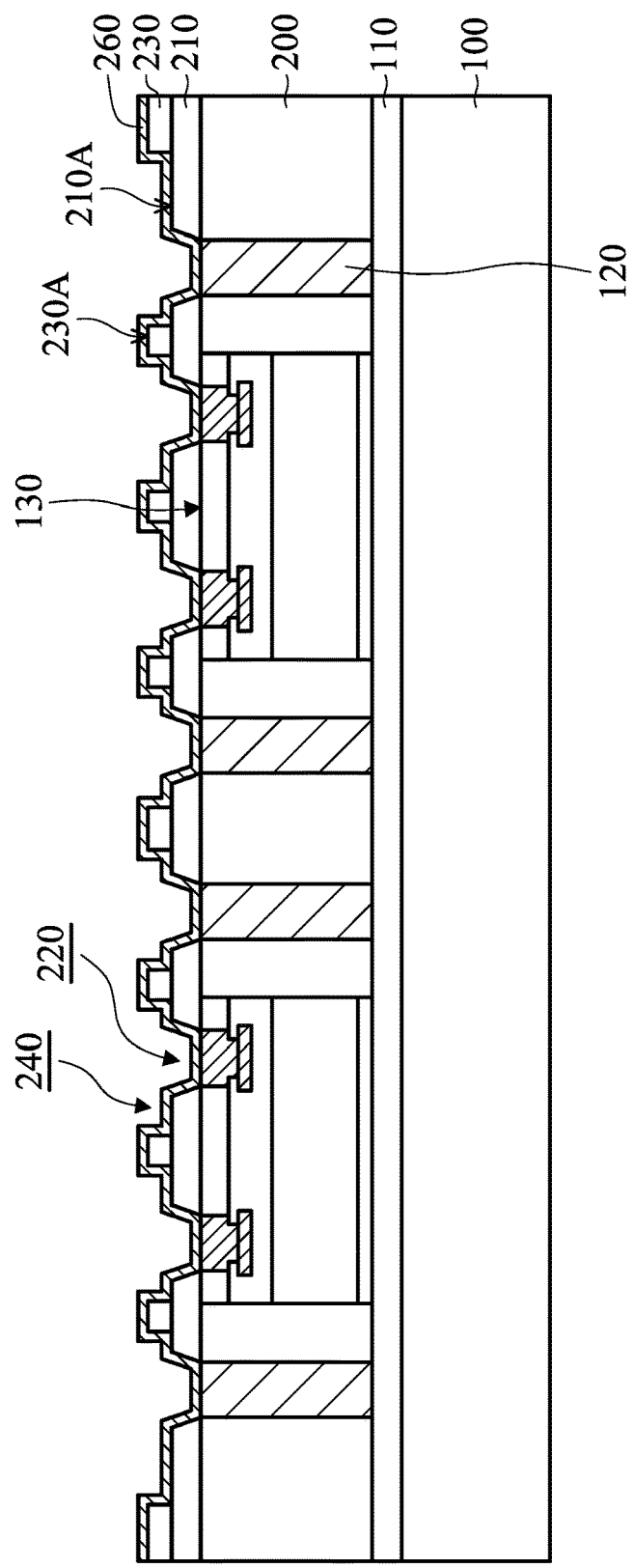

As shown in FIG. 1E, a seed layer 260 is deposited over the passivation layer 210 and the passivation layer 230, in accordance with some embodiments. The seed layer 260 is used to assist in the subsequent deposition of the conductive layer 270 (shown in FIGS. 1F-1H).

In some embodiments, the seed layer 260 is conformally deposited over the passivation layer 210 and the passivation layer 230. In some embodiments, the seed layer 260 covers the top surface 230A of the passivation layer 230 and the exposed top surface 210A of the passivation layer 210. In some embodiments, the seed layer 260 covers the bottom and the sidewalls of the openings 220 and the openings 240.

In some embodiments, the seed layer 260 is made of a metal material. The metal material may include Cu, Cu alloy, Al, Al alloy, tungsten (W), W alloy, titanium (Ti), Ti alloy, tantalum (Ta), Ta alloy, another suitable material, or a combination thereof. In some embodiments, the seed layer 260 is formed by a sputtering process, an electroplating process, an electroless plating process, a PVD process, a CVD process, an ALD process, or another applicable process.

Figure 1F:
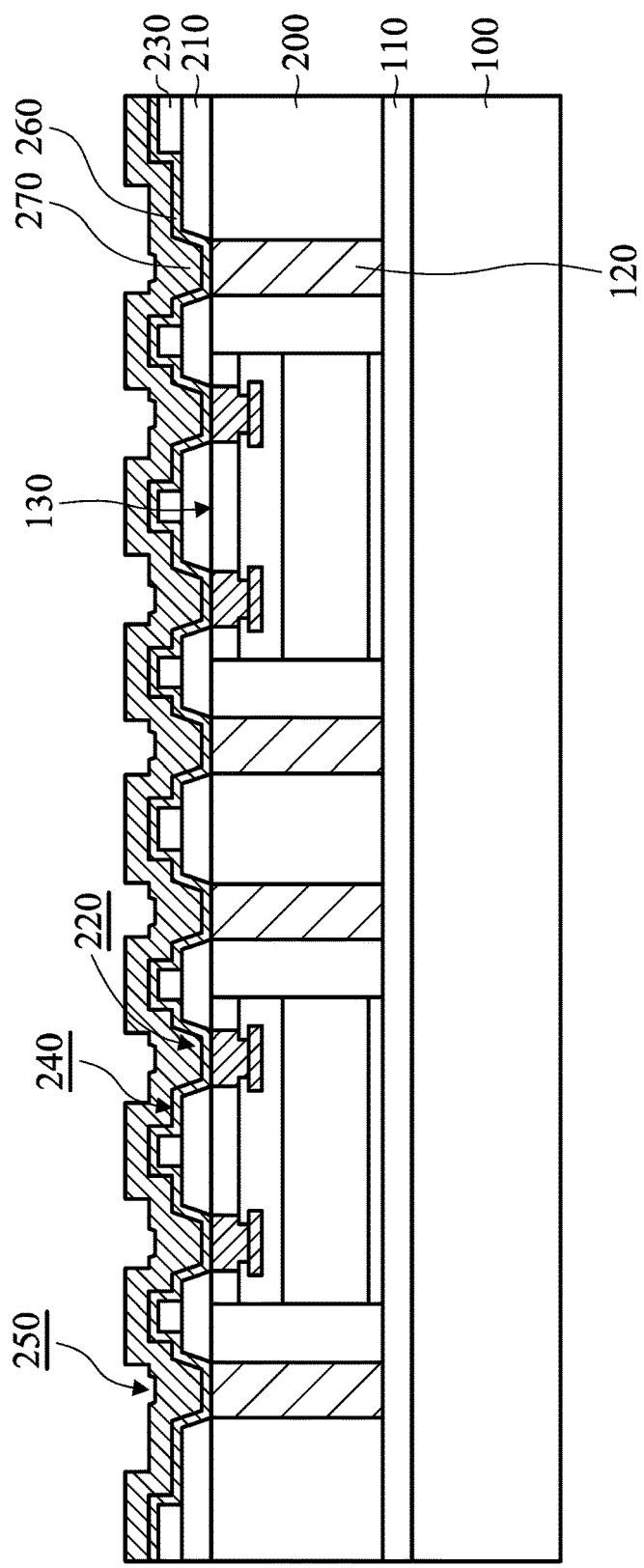

As shown in FIG. 1F, the conductive layer 270 is deposited over the seed layer 260, in accordance with some embodiments. The conductive layer 270 fills up the openings 220 and the openings 240, and covers the passivation layer 210 and the passivation layer 230.

In some embodiments, the conductive layer 270 is conformally deposited over the seed layer 260. In some embodiments, an undesirable recess 250 is formed in the conductive layer 270 due to the openings 220 and the openings 240, as shown in FIG. 1F. The position of the recess 250 corresponds to that of the openings 220 and the openings 240 which are in connection with each other. The profile of the recess 250 is similar to that of the combination of the openings 220 and the openings 240. However, embodiments of the disclosure are not limited thereto. In some other embodiments, no recess is formed in the conductive layer 270.

In some embodiments, the seed layer 260 and the conductive layer 270 are deposited after the deposition of the passivation layer 210 and the passivation layer 230. In some embodiments, the recess 250 is formed after the deposition of the passivation layer 210 and the passivation layer 230. In some embodiments, no seed layer and/or conductive layer is deposited after the deposition of the passivation layer 210 and before the deposition of the passivation layer 230. In some embodiments, no mask layer, such as a photoresist layer, is deposited after the deposition of the passivation layer 210 and before the deposition of the passivation layer 230.

In some embodiments, the conductive layer 270 is made of a metal material. The metal material may include Cu, Cu alloy, Al, Al alloy, W, W alloy, Ti, Ti alloy, Ta, Ta alloy, another suitable material, or a combination thereof. In some embodiments, the conductive layer 270 is formed by an electroplating process, or another applicable process.

Subsequently, a planarization process is performed over the conductive layer 270, in accordance with some embodiments. The conductive layer 270 is thinned and planarized during the planarization process. As a result, the recess 250 in the conductive layer 270 is eliminated. In some embodiments, the planarization process includes a cutting process or another applicable process. In some embodiments, the cutting process is a fly-cutting process or another suitable cutting process.

Figure 1G:
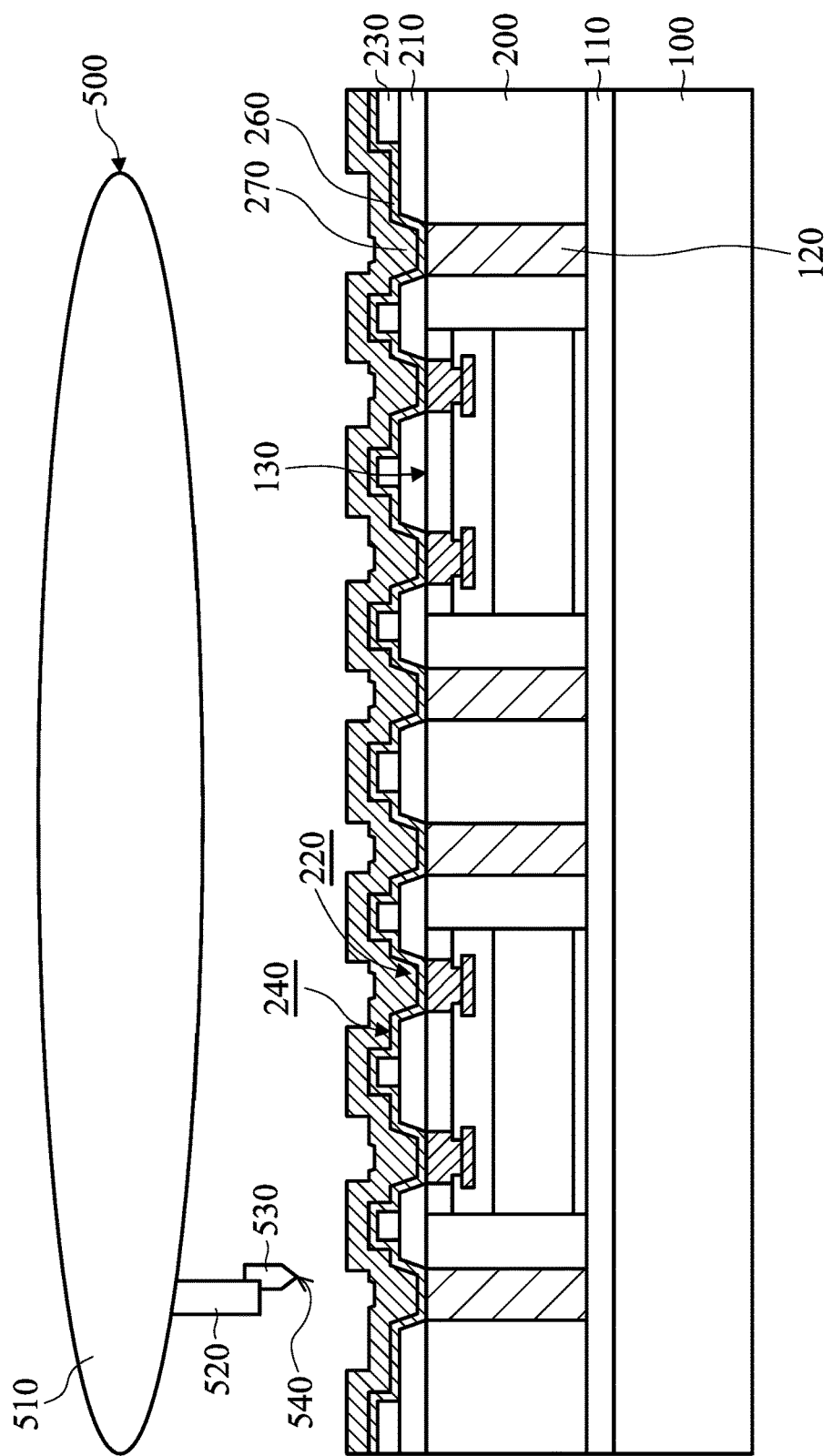

As shown in FIG. 1G, a cutting device 500 is used to perform the planarization process over the conductive layer 270, in accordance with some embodiments. In some embodiments, the cutting device 500 includes a base 510, a clamp 520 and a cutting head 530. The clamp 520 is connected to the base 510. The cutting head 530 is fixed to the clamp 520. In some embodiments, the cutting head 530 handled by the clamp 520 is rotatable and movable with respect to the base 510 during the planarization process. The cutting device 500 further includes a motor (not shown), and the motor is driven to move the cutting head 530.

In some embodiments, the cutting head 530 rotates along an axis in a direction, either clockwise or counter-clockwise, during the planarization process. The axis may be substantially perpendicular to the top surface 230A of the passivation layer 230 or the main surface of the integrated circuit dies 130. The main surface of the integrated circuit dies 130 may be an active surface of the integrated circuit dies 130. The rotation direction and speed of the cutting head 530 can be varied according to requirements.

In some embodiments, the structure shown in FIG. 1F moves relative to the cutting device 500 shown in FIG. 1G during the planarization process. In some embodiments, the structure shown in FIG. 1F moves along a direction that is substantially parallel to the main surface of the integrated circuit dies 130. In some embodiments, the structure shown in FIG. 1F moves along a direction that is substantially perpendicular to the rotation axis of the cutting head 530. The moving speed of the structure shown in FIG. 1F can be varied according to requirements.

In some embodiments, the cutting surface 540 of the cutting head 530 is inclined to the top surface 230A of the passivation layer 230. However, embodiments of the disclosure are not limited thereto. In some other embodiments, the cutting surface 540 of the cutting head 530 is substantially parallel to the top surface 230A of the passivation layer 230. The angle between the cutting surface 540 and the top surface 230A can be varied according to requirements.

Although FIG. 1G shows that the cutting surface 540 of the cutting head 530 forms a sharp end or tip, embodiments of the disclosure are not limited thereto. In some other embodiments, the cutting surface 540 of the cutting head 530 is rounded, curved, or another suitable shape. The profile of the cutting surface 540 can be varied according to requirements. In some embodiments, the cutting head 530 includes diamond or another suitable hard material. The cutting head 530 may include single crystal diamond.

Figure 1H:
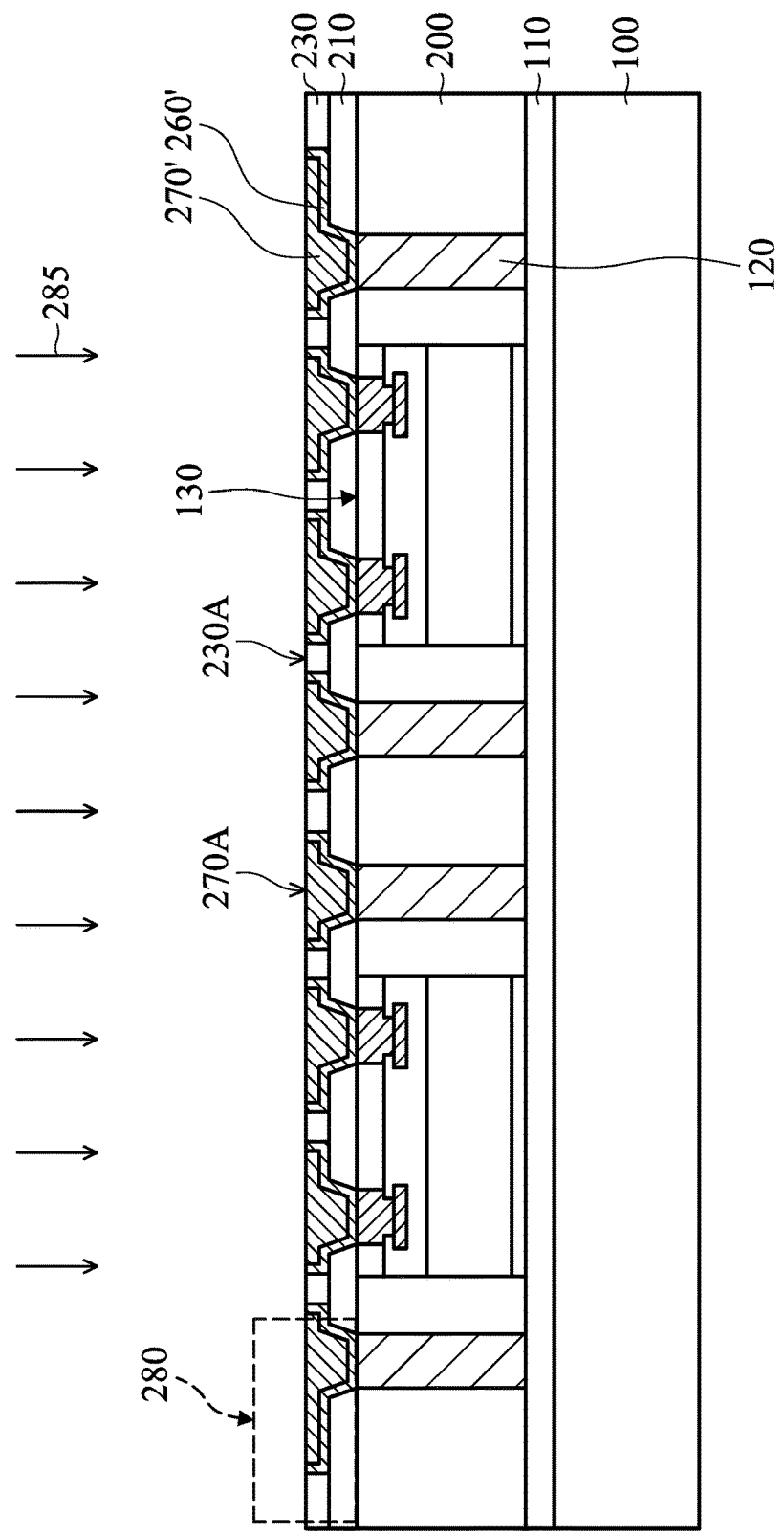

As shown in FIGS. 1G and 1H, the conductive layer 270 and the seed layer 260 are partially removed after the planarization process, in accordance with some embodiments. In some embodiments, portions of the conductive layer 270 outside the openings 220 and the openings 240 are cut and removed by the cutting head 530. As a result, the recess 250 in the conductive layer 270 is eliminated. The conductive layer 270 remaining in the openings 220 and the openings 240 forms a conductive layer 270'. In some embodiments, the conductive layer 270' has a planarized top surface 270A.

In some embodiments, portions of the seed layer 260 outside the openings 220 and the openings 240 are also cut and removed by the cutting head 530. As a result, the top surface 230A of the passivation layer 230 becomes exposed after the planarization process. The seed layer 260 remaining in the openings 220 and the openings 240 forms a seed layer 260'. The seed layer 260' and the conductive layer 270' together form the first RDL that is electrically connected to the integrated circuit dies 130 and the conductive features 120. In some embodiments, there is no selectivity during the planarization process so that the conductive layer 270 and the seed layer 260 are simultaneously partially removed.

In some embodiments, the passivation layer 230 is cut and partially removed by the cutting head 530. As a result, the passivation layer 230 becomes thinner after the planarization process. It can be ensured that portions of the seed layer 260 and the conductive layer 270, which covers the top surface 230A of the passivation layer 230, are removed cleanly. In some embodiments, the passivation layer 230, the conductive layer 270 and the seed layer 260 are simultaneously partially removed. However, embodiments of the disclosure are not limited thereto. In some other embodiments, the passivation layer 230 is not cut and removed during the planarization process.

In some embodiments, a clean treatment 285 is performed over the passivation layer 230, the conductive layer 270' and the seed layer 260' after the planarization process, as shown in FIG. 1H. For example, a solution is used to clean the top surface 230A and the top surface 270A after the cutting process. The solution may include water or another suitable material.

Figure 2:
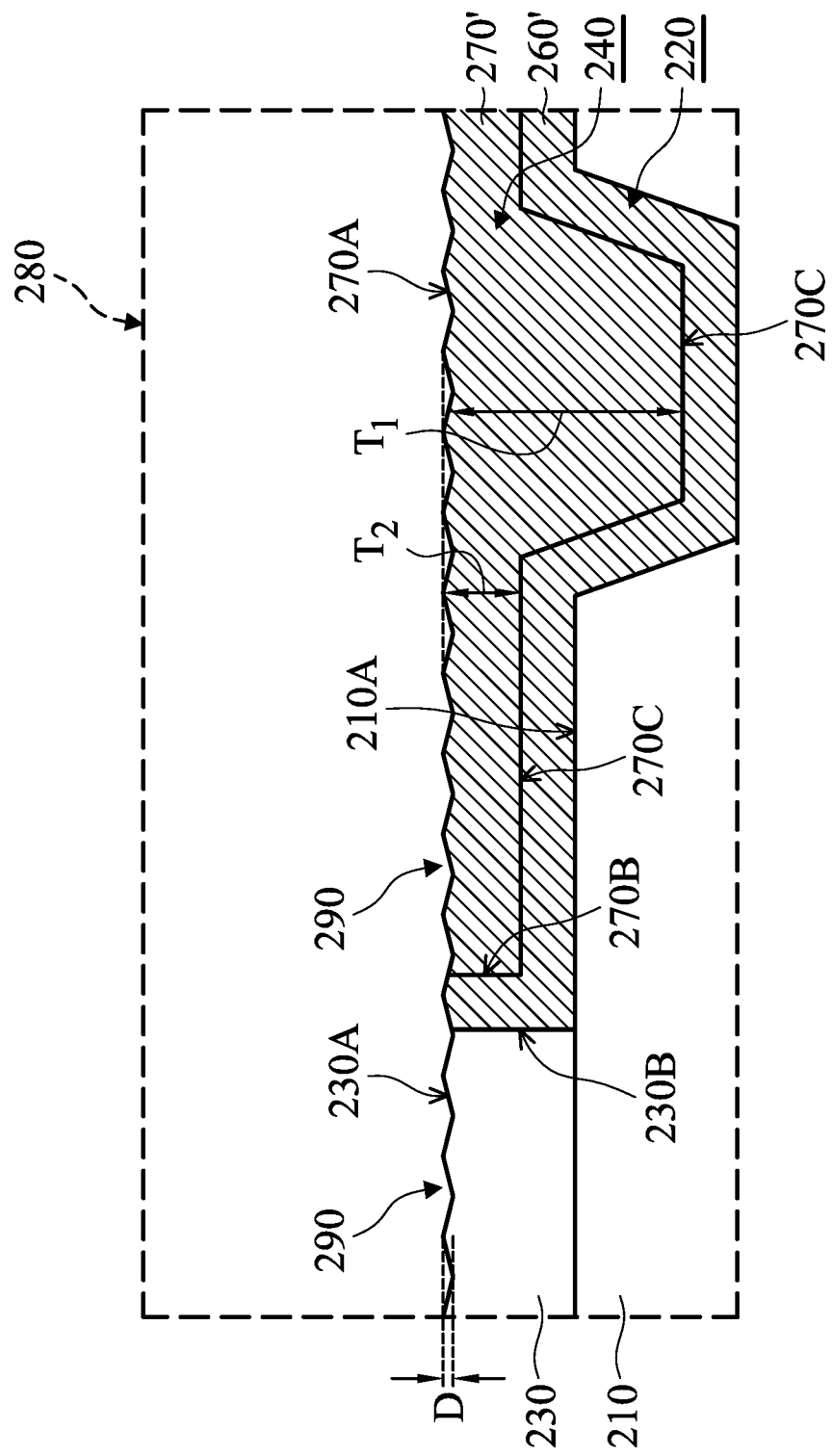
FIG. 2 is an enlarged cross-sectional view of one of various stages of a process for forming a package structure, in accordance with some embodiments.
Figure 3:
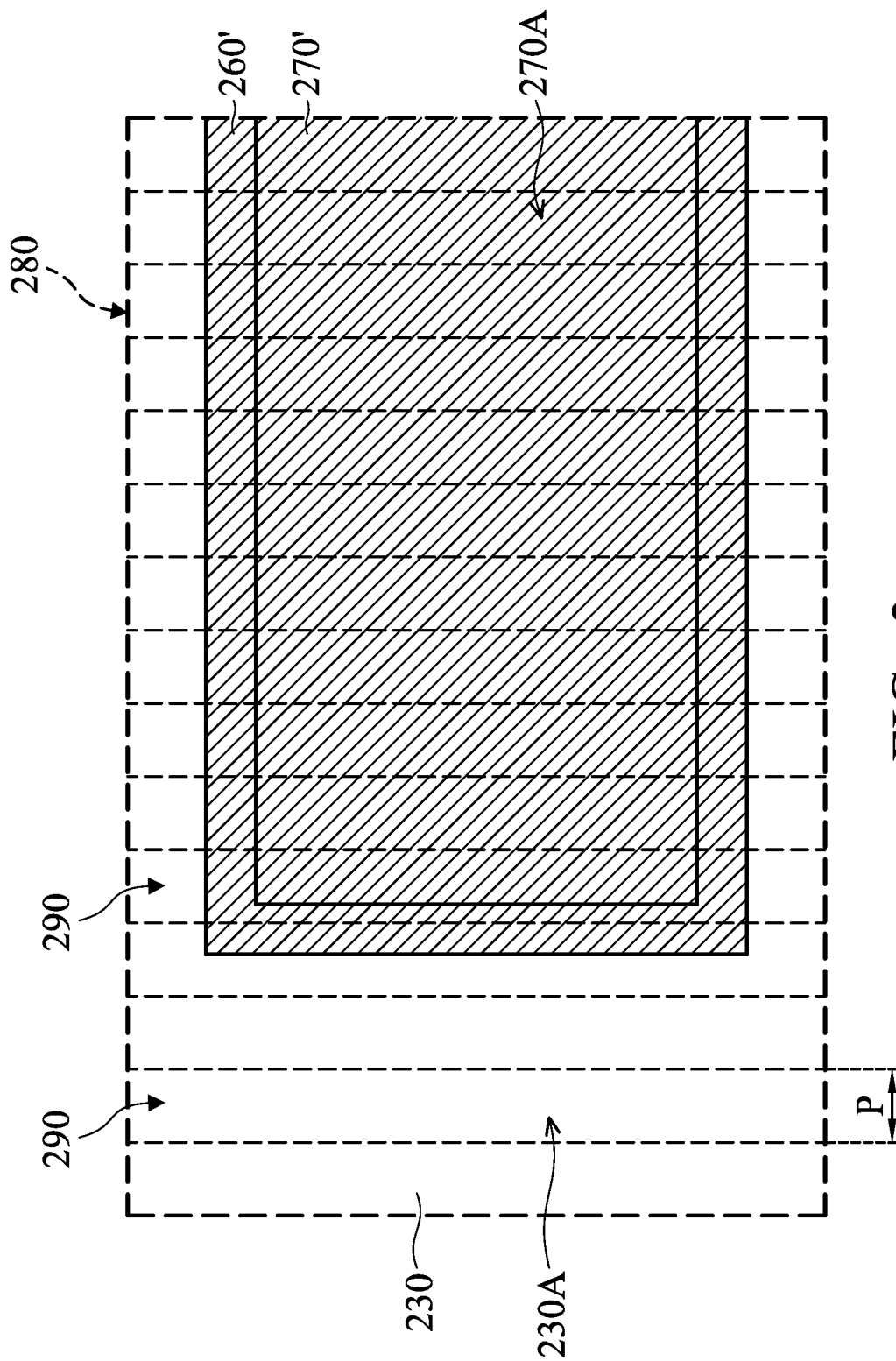
FIG. 3 is an enlarged top view of one of various stages of a process for forming a package structure, in accordance with some embodiments.

FIG. 2 is an enlarged cross-sectional view of one of various stages of a process for forming a package structure, in accordance with some embodiments. FIG. 3 is an enlarged top view of one of various stages of a process for forming a package structure, in accordance with some embodiments. In some embodiments, FIGS. 2 and 3 show an enlarged view of the portion 280 shown in FIG. 1H.

As shown in FIGS. 1H and 2, the top surface 270A of the conductive layer 270' is substantially aligned to the top surface 230A of the passivation layer 230 after the planarization process, in accordance with some embodiments. The top surface 270A and the top surface 230A together form a substantially flat surface. In some embodiments, the conductive layer 270' is not recessed from the top surface 270A after the planarization process. In some embodiments, the conductive layer 270' has no recess corresponding to the openings 220 and the openings 240 after the planarization process.

In some embodiments, a portion of the conductive layer 270' covering the connectors 180 is thicker than another portion of the conductive layer 270' covering the top surface 210A of the passivation layer 210, as shown in FIG. 1H. For example, the conductive layer 270' has different thicknesses $T_1$ and $T_2$, as shown in FIG. 2. The thicknesses $T_1$ is measured from the top surface 270A to the bottom surface 270C in the openings 220 while the thicknesses $T_2$ is measured from the top surface 270A to the bottom surface 270C in the openings 240. In some embodiments, the thicknesses $T_1$ is greater than the thicknesses $T_2$. In some embodiments, the thicknesses $T_1$ is greater than the thicknesses of the passivation layer 230. The thicknesses $T_1$ may be nearly or substantially equal to the total thickness of the passivation layer 210 and the passivation layer 230.

As shown in FIGS. 1H and 2, a portion of the seed layer 260' is exposed from the passivation layer 230 after the planarization process, in accordance with some embodiments. In some embodiments, a portion of the seed layer 260' extends from the bottom surface 270C of the conductive layer 270' towards the top surface 270A along the sidewall 270B of the conductive layer 270'. As a result, the seed layer 260' separates the conductive layer 270' from the passivation layer 230. In some embodiments, the seed layer 260' covers the sidewall 270B of the conductive layer 270' and the sidewall 230B of the passivation layer 230. In some embodiments, a portion of the seed layer 260' is sandwiched between the sidewall 270B and the sidewall 230B.

As shown in FIGS. 2 and 3, notches 290 are formed after the planarization process, in accordance with some embodiments. The notches 290 may be referred to as cutting traces, clefts or dents. The notches 290 may be observed using an optical or electron microscope such as an atomic force microscope (AFM) or another suitable microscope. The notches 290 may not be seen from a macroscopic view. The notches 290 may have a cross-sectional profile corresponding to that of the cutting surface 540 of the cutting head 530. For example, the cross-sectional profile of each notch 290 may be V-shaped, U-shaped or another suitable shape.

In some embodiments, the notches 290 are alternately arranged in an array on the top surface 270A of the conductive layer 270' and the top surface 230A of the passivation layer 230. In some embodiments, the notches 290 are recessed lines or strips. In some embodiments, due to the notches 290, the top surface 270A and the top surface 230A are non-coplanar with each other, as observed using an optical or electron microscope. For example, the top surface 270A and the top surface 230A may be rough or zigzag due to the shallow notches 290, as seen from a microscopic view. In some embodiments, the top surface 270A and the top surface 230A are smooth and substantially coplanar with each other, as seen from a macroscopic view.

In some embodiments, the notches 290 extend across or overlap the sidewall 270B of the conductive layer 270' and the sidewall 230B of the passivation layer 230. In some embodiments, the notches 290 extend across the interface between the conductive layer 270' and the seed layer 260' (i.e., the sidewall 270B of the conductive layer 270'). In some embodiments, the notches 290 extend across the interface between the seed layer 260' and the passivation layer 230 (i.e., the sidewall 230B of the passivation layer 230).

In some embodiments, the notches 290 have a depth D in a range from about 10 nm to about 200 nm. Although FIG. 2 shows that the notches 290 have substantially the same depth D, embodiments of the disclosure are not limited thereto. In some other embodiments, the notches 290 have different depths.

In some embodiments, the pitch P between the notches 290 is in a range from about 5 μm to about 150 μm. Although FIG. 3 shows that the notches 290 have substantially uniform pitch P, embodiments of the disclosure are not limited thereto. In some other embodiments, the notches 290 have different pitches. The pitch P and the depth D can be varied according to requirements.

As shown in FIGS. 2 and 3, the notches 290 are arranged periodically, in accordance with some embodiments. However, embodiments of the disclosure are not limited thereto. In some other embodiments, the notches 290 are arranged at random or disorderly. In some other embodiments, the notches 290 are spaced apart from each other. Alternatively, one of the notches 290 may overlap with another of the notches 290. The arrangement of the notches 290 can be varied according to requirements.

Subsequently, the steps described in FIGS. 1C-1G are performed over the structure shown in FIG. 1H, in accordance with some embodiments. The steps described in FIGS. 1C-1G are repeated one or more times to finish the formation of the redistribution structure.

Figure 1I:
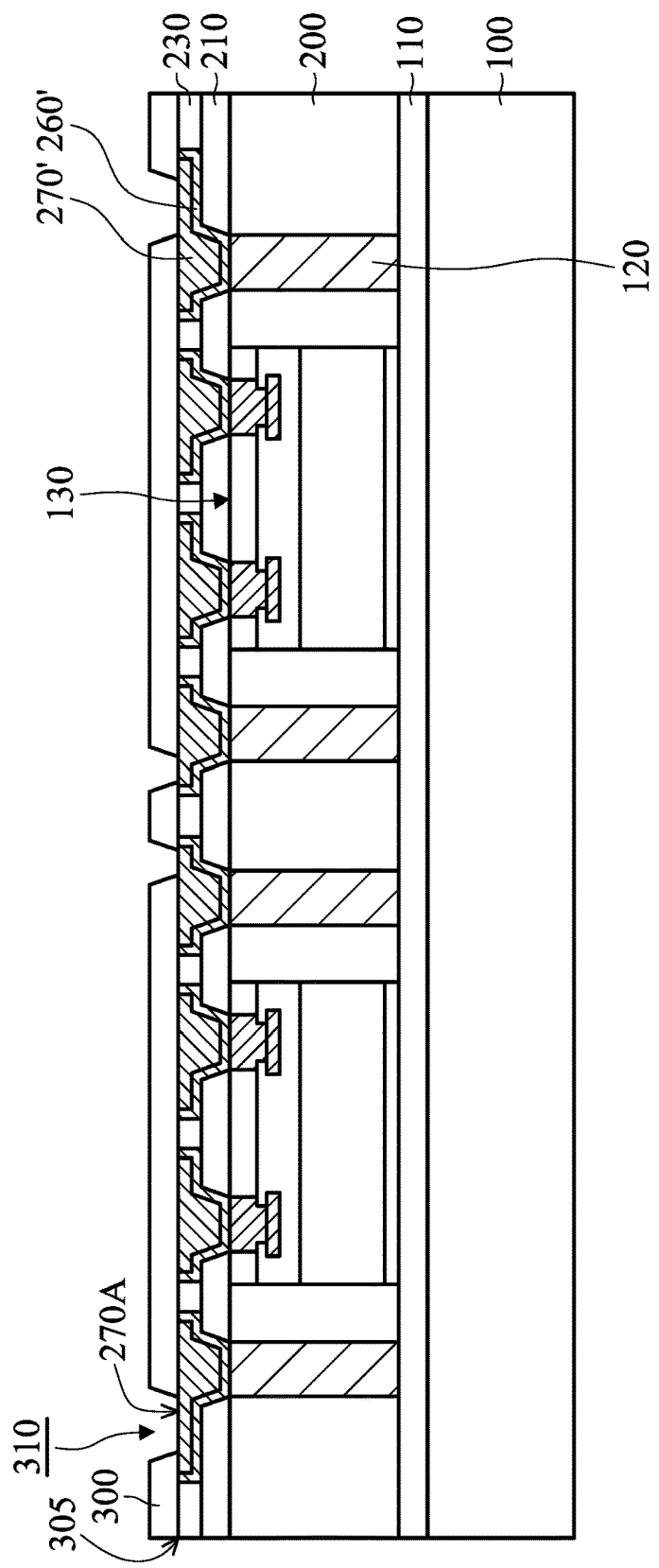

For example, as shown in FIG. 1I, the passivation layer 300 is deposited over the passivation layer 230, in accordance with some embodiments. The deposited passivation layer 300 covers the seed layer 260' and the conductive layer 270'. In some embodiments, the deposited passivation layer 300 is in direct contact with the seed layer 260' and the conductive layer 270'. In some embodiments, the deposited passivation layer 300 covers the notches 290. Afterwards, the deposited passivation layer 300 is partially removed to form openings 310. In some embodiments, the conductive layer 270' is partially exposed through some of the openings 310. In some embodiments, some of the notches 290 are partially exposed through the openings 310.

In some embodiments, the interface 305 between the passivation layer 230 and the passivation layer 300 is substantially aligned to the top surface 270A of the conductive layer 270', as shown in FIG. 1I. In some embodiments, the interface 305 between the passivation layer 230 and the passivation layer 300 is substantially coplanar with the top surface 270A of the conductive layer 270', as seen from a macroscopic view. The interface 305 between the passivation layer 230 and the passivation layer 300 may not be observed.

Figure 1J:
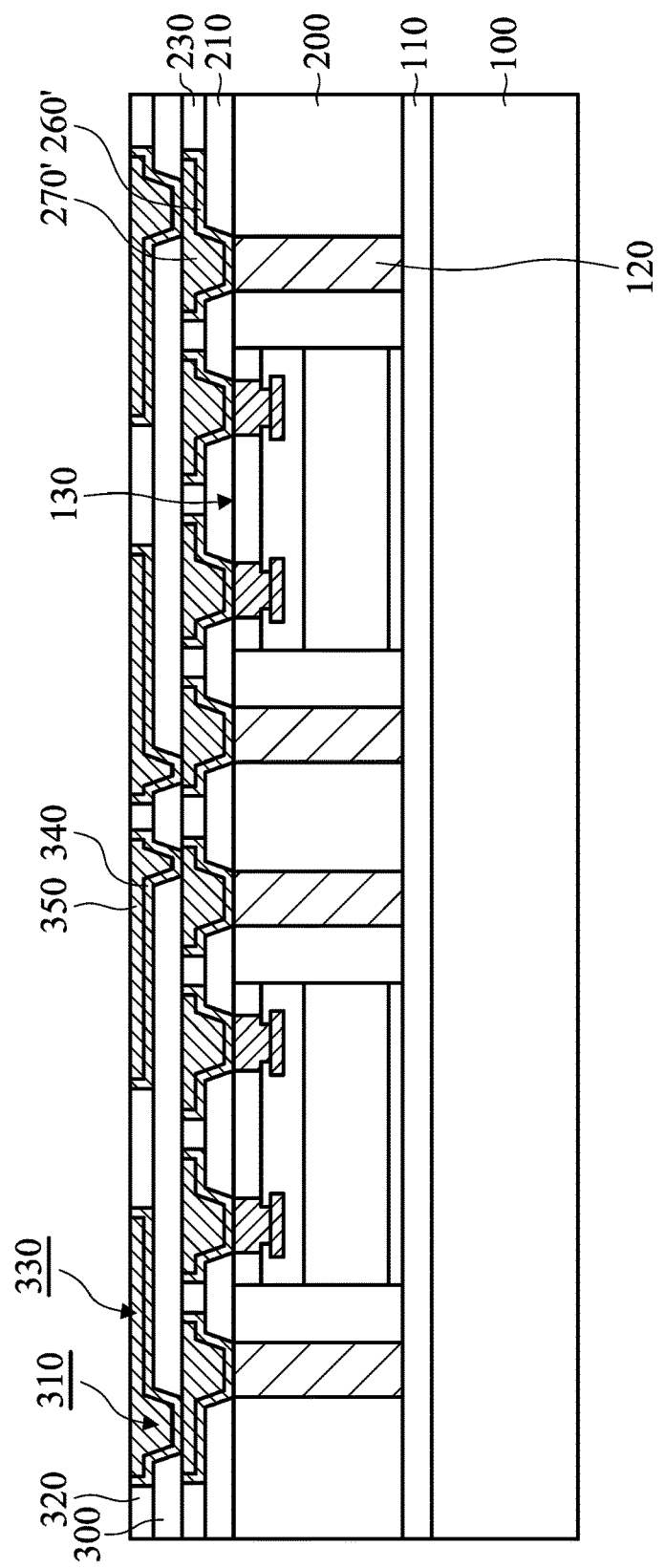

As shown in FIG. 1J, the passivation layer 320 is deposited over the passivation layer 300, in accordance with some embodiments. Afterwards, the deposited passivation layer 320 is partially removed to form openings 330. The openings 330 are in connection with the openings 310 in the passivation layer 300. As a result, the openings 310 and the openings 330 together define the pattern of a second RDL.

The materials and/or formation methods of the passivation layers 300 and 320 are the same as or similar to those of the passivation layers 210 and 230, as illustrated in the aforementioned embodiments, and are not repeated. The formation methods and/or profile of the openings 310 and 330 are the same as or similar to those of the openings 220 and 240, as illustrated in the aforementioned embodiments, and are not repeated.

Afterwards, a seed layer and a conductive layer are sequentially deposited over the passivation layer 300 and the passivation layer 320 to fill up the openings 310 and the openings 330, in accordance with some embodiments. Subsequently, a planarization process is performed over the deposited conductive layer until the top surface of the passivation layer 320 is exposed. As a result, the seed layer and the conductive layer remaining in the openings 310 and the openings 330 form the seed layer 340 and the conductive layer 350, respectively. The seed layer 340 and the conductive layer 350 together form the second RDL that is electrically connected to the integrated circuit dies 130 and the conductive features 120.

In some embodiments, the deposited conductive layer is recessed from its top surface due to the openings 310 and the openings 330. The planarization process is used to remove the recess in the deposited conductive layer. As a result, the conductive layer 350 has a planarized top surface. Similarly, in some embodiments, multiple notches are formed on the top surface of the conductive layer 350 and the top surface of the passivation layer 320.

The materials and/or formation methods of the seed layer 340 and the conductive layer 350 are the same as or similar to those of the seed layer 260' and the conductive layer 270', as illustrated in the aforementioned embodiments, and are not repeated.

Figure 1K:
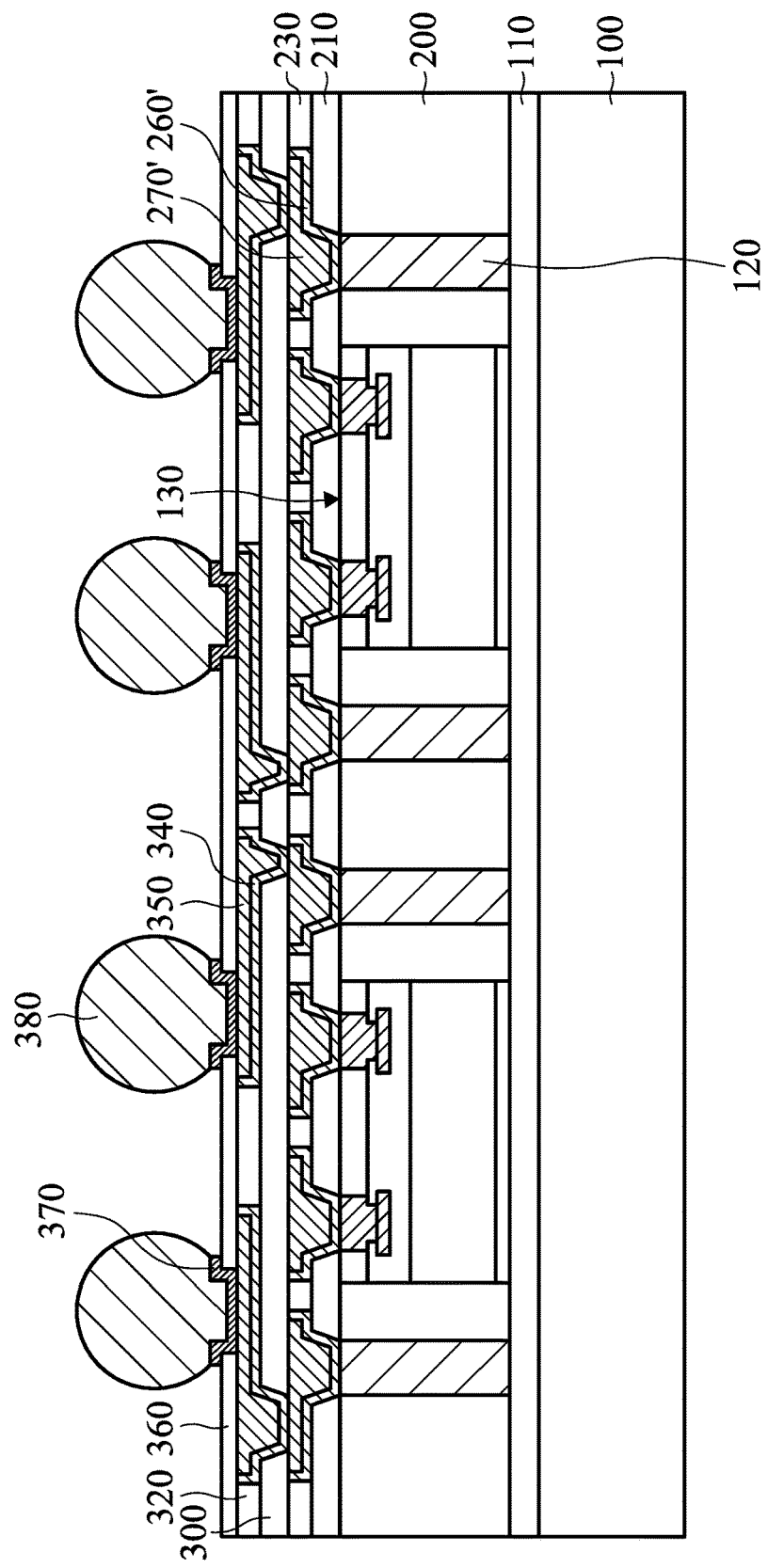

As shown in FIG. 1K, a passivation layer 360 is deposited over the passivation layer 320, in accordance with some embodiments. The deposited passivation layer 360 covers the seed layer 340 and the conductive layer 350. In some embodiments, the deposited passivation layer 360 covers the notches on the top surface of the conductive layer 350 and the top surface of the passivation layer 320. Afterwards, the deposited passivation layer 360 is partially removed to openings. The conductive layer 350 is partially exposed through the openings in the passivation layer 360. In some embodiments, some of the notches on the top surface of the conductive layer 350 are partially exposed through the openings in the passivation layer 360.

The materials and/or formation methods of the passivation layer 360 with openings are the same as or similar to those of the passivation layers 210 with the openings 220, as illustrated in the aforementioned embodiments, and are not repeated.

As shown in FIG. 1K, under bump metallization (UBM) structures 370 are formed in the openings in the passivation layer 360, in accordance with some embodiments. The UBM structures 370 are electrically connected to the exposed conductive layer 350. In some embodiments, an interface between the UBM structures 370 and the conductive layer 350 is substantially aligned to the top surface of the passivation layer 320. In some embodiments, the UBM structures 370 cover the exposed notches on the top surface of the conductive layer 350. The UBM structures 370 may include a bond pad and one or more UBM layers over the exposed conductive layer 350. In some other embodiments, the UBM structures 370 are not formed.

As shown in FIG. 1K, multiple connectors 380 are formed over the UBM structures 370, in accordance with some embodiments. In some embodiments, the connectors 380 are electrically connected to the exposed conductive layer 350 through the UBM structures 370. The connectors 380 include solder bumps, metal pillars, other suitable connectors, or a combination thereof.

Afterwards, the carrier substrate 100 is removed. In some embodiments, both the carrier substrate 100 and the adhesive layer 110 are removed. Suitable light may be provided to remove the adhesive layer 110 so as to lift off the carrier substrate 100 as well.

Figure 1L:
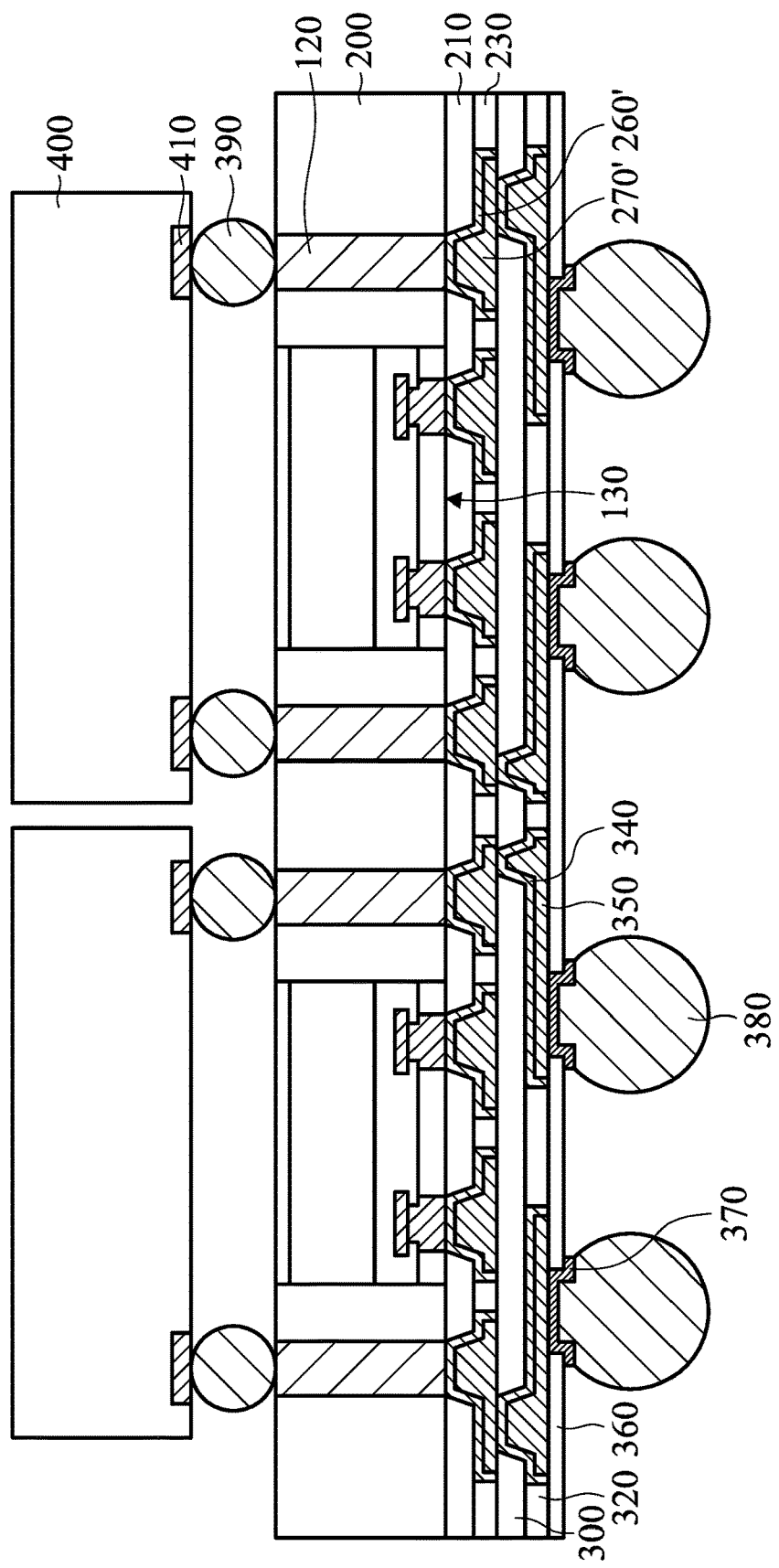

As shown in FIG. 1L, one or more elements 400 are stacked over the integrated circuit dies 130 and the conductive features 120, in accordance with some embodiments. In some embodiments, each of the elements 400 includes a package structure that contains one or more integrated circuit dies. However, embodiments of the disclosure are not limited thereto. In some other embodiments, each of the elements 400 is an integrated circuit die. For example, the integrated circuit die may be a dynamic random access memory (DRAM) die or another suitable die. The elements 400 can be varied according to requirements.

In some embodiments, one or more connectors 390 are used to achieve the bonding between the elements 400 and the conductive features 120, as shown in FIG. 1L. The elements 400 are electrically connected to the integrated circuit dies 130 through the connectors 390, the conductive features 120 and the described redistribution structure. The connectors 390 include solder bumps, metal pillars, other suitable connectors, or a combination thereof.

Many variations and/or modifications can be made to embodiments of the disclosure. In some other embodiments, an underfill layer (not shown) is deposited to fill a space between one of the integrated circuit dies 130 and one of the elements 400 thereon. As a result, the connectors 390 are embedded in the underfill layer. The underfill layer is a liquid epoxy, deformable gel, silicon rubber, another suitable material, or a combination thereof. In some embodiments, a dispensing process is performed to form the underfill layer.

Afterwards, a singulation process is performed to separate the structure as shown in FIG. 1L into multiple package structures, in accordance with some embodiments. In some embodiments, a dicing process is performed along the scribe line between the integrated circuit dies 130. As a result, separated package structures are formed. Each of the package structures includes one or more integrated circuit dies 130 and one or more elements 400.

In some cases, the formation of a redistribution structure includes forming a first passivation layer having openings. A seed layer is then deposited on the first passivation layer and extends in the openings. A photoresist layer is deposited, exposed and developed to define a region over the seed layer, and a plating layer is deposited on the seed layer in the region. Afterwards, the patterned photoresist layer is stripped. Portions of the seed layer, which are not covered by the plating layer, are removed so that a first RDL is formed. The first RDL may have undesirable recesses due to the openings in the first passivation. Next, a second passivation layer is deposited on the first RDL, and a second RDL is subsequently formed. The second passivation layer may also have undesirable recesses due to the undesirable recesses in the first RDL, and thus the second RDL may fall into the undesirable recesses in the second passivation layer. As a result, there may be pattern distortion during the photolithography process for forming the second RDL or reliability of the second RDL may be degraded.

According to some embodiments of the disclosure, the material of the first RDL is deposited after the formation of the first and second passivation layers with openings. The material of the first RDL fills the openings of the first and second passivation layers. Afterwards, a planarization process is performed over the material of the first RDL. As a result, the first RDL is formed in the openings of the first and second passivation layers and has a planarized top surface without surface defects, such as an undesirable recess. The third passivation layer can be deposited over a sufficiently flat and smooth surface and does not have an undesirable recess. Accordingly, the subsequently formed second RDL is prevented from cracking or other defects, which may be induced due to an undesirable recess. Pattern distortion issues are greatly mitigated or eliminated. Therefore, the reliability of the package structure is improved. Since the RDL and the overlying passivation layer have a planarized top surface without an undesirable recess, embodiments of the disclosure can be used to fabricate RDLs with finer line width and space.

In accordance with some embodiments of the disclosure, no photoresist layer is deposited, exposed, developed and stripped during the formation of the RDL. In some embodiments, the seed layer of the RDL is not patterned or etched. The material of the RDL is directly patterned into the RDL using a planarization process, such as a cutting process. As a result, the cost and the fabrication time of the package structure are reduced significantly. Accordingly, embodiments of the disclosure provide a more simplified and faster packaging process.

Many variations and/or modifications can be made to embodiments of the disclosure. For example, although the embodiments shown in FIGS. 1A-1L provide a package structure having a "fan-out" feature, embodiments of the disclosure are not limited thereto. Some other embodiments of the disclosure include package structures having a "fan-in" feature.

Many variations and/or modifications can be made to embodiments of the disclosure. For example, although the embodiments shown in FIGS. 1A-1L provide a package on package (PoP) structure, embodiments of the disclosure are not limited thereto. In some other embodiments, there is not another package structure or integrated circuit die stacked over the integrated circuit dies 130, and the conductive features 120 are not formed.

Although the embodiments shown in FIGS. 1A-1L provide a package structure with a redistribution structure, embodiments of the disclosure are not limited thereto. Embodiments of the disclosure may be applied to fabrication processes for any suitable structure including conductive and passivation layers.

Embodiments of the disclosure provide a package structure and methods for forming the same. The package structure includes multiple passivation layers and RDLs. A first passivation layer having a first opening and a second passivation layer having a second opening are sequentially formed. A conductive layer is deposited over the first and second passivation layers. Afterwards, a planarization process is performed over the conductive layer so that a first RDL is formed. The first RDL has a planarized top surface without surface defects. As a result, a third passivation layer can be deposited over a sufficiently flat and smooth surface. The subsequently formed second RDL is prevented from cracking or other defects. Therefore, the reliability of the package structure is improved. Since the conductive layer is directly patterned into the RDL using a planarization process, such as a cutting process, the cost and the fabrication time of the package structure are reduced.

In accordance with some embodiments, a package structure is provided. The package structure includes an integrated circuit die in a package layer. The package structure also includes a first passivation layer covering the package layer and the integrated circuit die. The package structure further includes a second passivation layer over the first passivation layer. In addition, the package structure includes a seed layer in the second passivation layer. The seed layer covers the top surface of the first passivation layer and extends into the first passivation layer. The package structure also includes a conductive layer in the second passivation layer. The conductive layer covers the seed layer and extends into the first passivation layer. The package structure further includes a third passivation layer covering the second passivation layer. The seed layer further extends from the top surface of the first passivation layer to the third passivation layer along a sidewall of the conductive layer.

In accordance with some embodiments, a method for forming a package structure is provided. The method includes forming an integrated circuit die in a package layer. The method also includes forming a first passivation layer covering the package layer. The method further includes forming a second passivation layer covering the first passivation layer. In addition, the method includes forming a conductive layer covering the second passivation layer. The conductive layer penetrates through the second passivation layer and extends into the first passivation layer to electrically connect to the integrated circuit die. The method also includes cutting the conductive layer to thin the conductive layer.

In accordance with some embodiments, a method for forming a package structure is provided. The method includes forming a package layer to surround an integrated circuit die. The method also includes forming a first passivation layer covering the package layer. The first passivation layer has a first opening partially exposing the integrated circuit die. The method further includes forming a second passivation layer covering the first passivation layer. The second passivation layer has a second opening in connection with the first opening. In addition, the method includes forming a seed layer covering a top surface of the second passivation layer and extending into the first opening and the second opening. The method also includes forming a conductive layer covering the seed layer and filling up the first opening and the second opening. The method further includes partially removing the seed layer and the conductive layer to expose the top surface of the second passivation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
    forming an integrated circuit die in a package layer;
    forming a first passivation layer covering the package layer;
    partially removing the first passivation layer to form a first opening exposing the integrated circuit die;
    forming a second passivation layer covering the first passivation layer after forming the first opening;
    partially removing the second passivation layer to form a second opening in connection with the first opening;
    forming a conductive layer covering the second passivation layer, wherein the conductive layer penetrates through the second opening of the second passivation layer and extends into the first opening of the first passivation layer to electrically connect to the integrated circuit die; and
    cutting the conductive layer to thin the conductive layer, wherein a top surface of the thinned conductive layer is substantially level with a top surface of the second passivation layer.

2. The method for forming the package structure as claimed in claim 1, wherein notches are formed during the cutting of the conductive layer, and the notches are arranged in an array on the top surface of the thinned conductive layer and extend across a sidewall of the thinned conductive layer.

3. The method for forming the package structure as claimed in claim 1, wherein notches are formed on the top surface of the second passivation layer during the cutting of the conductive layer.

4. The method for forming the package structure as claimed in claim 1, further comprising:
forming a seed layer after the formation of the second passivation layer, wherein the seed layer is between the thinned conductive layer and the second passivation layer and between the thinned conductive layer and a portion of the first passivation layer; and
cutting the seed layer to expose the second passivation layer.

5. The method for forming the package structure as claimed in claim 1, wherein the conductive layer is cut using a cutting device, and a cutting head of the cutting device rotates during the cutting of the conductive layer.

6. The method for forming the package structure as claimed in claim 5, wherein the cutting head of the cutting device forms a sharp end.

7. A method for forming a package structure, comprising:
forming a package layer to surround an integrated circuit die;
forming a first passivation layer covering the package layer, wherein the first passivation layer has a first opening partially exposing the integrated circuit die;
forming a second passivation layer covering the first passivation layer, wherein the second passivation layer has a second opening in connection with the first opening;
forming a seed layer covering a top surface of the second passivation layer and extending into the first opening and the second opening;
forming a conductive layer covering the seed layer and filling up the first opening and the second opening; and
partially removing the seed layer and the conductive layer to expose the top surface of the second passivation layer, such that a top surface of the partially removed conductive layer is substantially level with the top surface of the second passivation layer.

8. The method for forming the package structure as claimed in claim 7, wherein portions of the seed layer and the conductive layer outside the first opening and the second opening are removed using a cutting process during the partial removal of the seed layer and the conductive layer.

9. The method for forming the package structure as claimed in claim 8, wherein notches are formed on the top surface of the second passivation layer and the top surface of the conductive layer during the cutting process.

10. The method for forming the package structure as claimed in claim 7, further comprising:
cleaning the top surface of the second passivation layer and the top surface of the conductive layer after the partial removal of the seed layer and the conductive layer; and
forming a third passivation layer covering the second passivation layer and the conductive layer after the cleaning.

11. The method for forming the package structure as claimed in claim 7, wherein the conductive layer has a recess corresponding to the first opening and the second opening before the removal of the portions, and the recess is eliminated after the partial removal of the seed layer and the conductive layer.

12. The method for forming the package structure as claimed in claim 11, further comprising forming a third passivation layer covering the conductive layer after the recess is eliminated.

13. The method for forming the package structure as claimed in claim 7, wherein the second passivation layer is partially removed during the partial removal of the seed layer and the conductive layer.

14. The method for forming the package structure as claimed in claim 7, wherein the seed layer remaining in the second opening is exposed after the partial removal of the seed layer and the conductive layer.

15. A method for forming a package structure, comprising:
forming a first passivation layer covering a package layer and an integrated circuit die in the package layer;
forming a second passivation layer over the first passivation layer, wherein the second passivation layer partially exposes a top surface of the first passivation layer;
forming a seed layer covering the second passivation layer, wherein the seed layer extends into the first passivation layer along the top surface of the first passivation layer;
forming a conductive layer covering the seed layer, wherein the conductive layer extends into the first passivation layer;
cutting the conductive layer and the seed layer such that the second passivation layer is exposed, wherein notches are formed on the conductive layer and the seed layer during the cutting of the conductive layer and the seed layer.

16. The method for forming the package structure as claimed in claim 15, further comprising forming a third passivation layer covering the second passivation layer after the cutting of the conductive layer and the seed layer, wherein the seed layer extends from the top surface of the first passivation layer to the third passivation layer along a sidewall of the conductive layer.

17. The method for forming the package structure as claimed in claim 16, wherein an interface between the second passivation layer and the third passivation layer is substantially aligned to a top surface of the conductive layer.

18. The method for forming the package structure as claimed in claim 16, further comprising cleaning top surfaces of the conductive layer, the seed layer and the second passivation layer before the formation of the third passivation layer.

19. The method for forming the package structure as claimed in claim 15, wherein the integrated circuit die comprises a connector, and the connector is exposed through the first passivation layer and the second passivation layer until the formation of the seed layer.

20. The method for forming the package structure as claimed in claim 19, wherein the conductive layer comprises a first portion covering the connector and a second portion covering the top surface of the first passivation layer, and wherein a thickness of the first portion is greater than a thickness of the second portion.

* * * * *